US005847475A

United States Patent [19]

Rauch et al.

[11] Patent Number: 5,847,475

[45] Date of Patent: Dec. 8, 1998

[54] METHOD OF CORRECTION BETWEEN ELECTRICAL PHASE ANGLE AND MECHANICAL OUTPUT ANGLE OF STEPPER MOTOR

[75] Inventors: Hans Rauch, Fuerth; Uwe Hovestadt, Hilpoltstein; Bernhard Herzog, Stuttgart; Martin Ehrmann, Erlangen, all of Germany

[73] Assignee: Robert Bosch GmbH, Stuttgart, Germany

[21] Appl. No.: 669,341

[22] PCT Filed: May 28, 1994

[86] PCT No.: PCT/DE94/00606

§ 371 Date: Jul. 1, 1996

§ 102(e) Date: Jul. 1, 1996

[87] PCT Pub. No.: WO95/18994

PCT Pub. Date: Jul. 13, 1995

[30] Foreign Application Priority Data

Jan. 11, 1994 [DE] Germany .......................... 44 00 482.6

[51] Int. Cl.[6] ............................ H02K 37/04; H02P 8/12; H02P 8/22; H02P 8/32

[52] U.S. Cl. .......................................... 310/49 R; 318/696

[58] Field of Search ............................... 310/49 R, 68 B; 318/696

[56] References Cited

U.S. PATENT DOCUMENTS 4,584,512 4/1986 Pritchard ................................ 318/696

FOREIGN PATENT DOCUMENTS 189794 8/1986 European Pat. Off. .
571759 12/1993 European Pat. Off. .
2850539 5/1980 Germany .
91/07009 5/1991 WIPO .

OTHER PUBLICATIONS

Patent Abstracts Of Japan, vol. 14, No. 451 (E–0984), 02–179298, Sep. 1990.

Patent Abstracts Of Japan, vol.9, No. 227(P–388), 60–085474, Sep. 1985.

Patent Abstracts Of Japan, vol.16, No.534(M–1334), 04–201059, Nov. 1992.

Soviet Patents Abstracts, Section EI, Week 8724, 1267360, Jun. 1987.

*Primary Examiner*—Clayton E. LaBalle
*Attorney, Agent, or Firm*—Michael J. Striker

[57] ABSTRACT

The invention describes a method that makes it possible to correct a nonlinear relationship between the electrical phase angle and the mechanical output angle of stepper motors, using a low-resolution encoder or the like. The method of the invention makes a compromise between the conventional closed-loop control of stepper motors, which requires high resolution of angular detection, and a purely static correction of the characteristic curve. The result is a substantial improvement in synchronization, for instance when conventional claw pole stepper motors are used, as a pointer drive for a gauge in a motor vehicle. The microstep triggering is done with a corrected sinusoidal form; for the correction, coefficients that are evaluated by means of a simplified Fourier synthesis are essentially used.

7 Claims, 6 Drawing Sheets

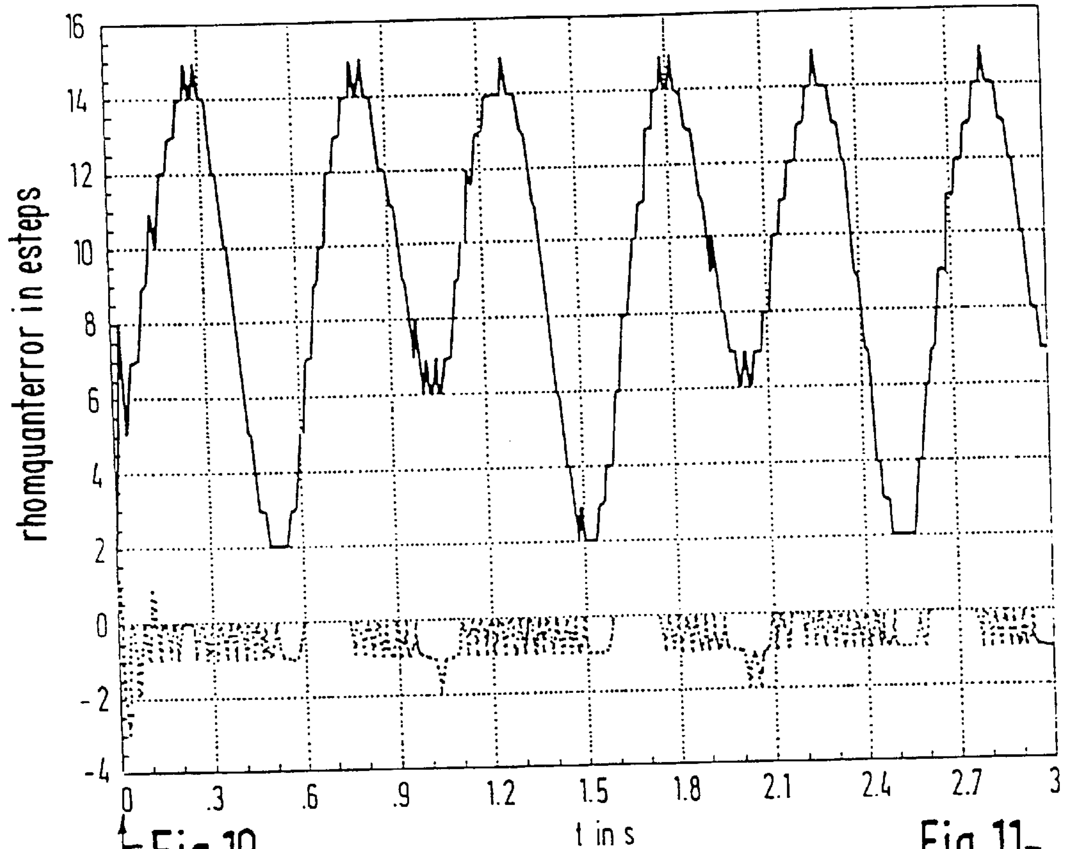
Fig.10
Fig.11
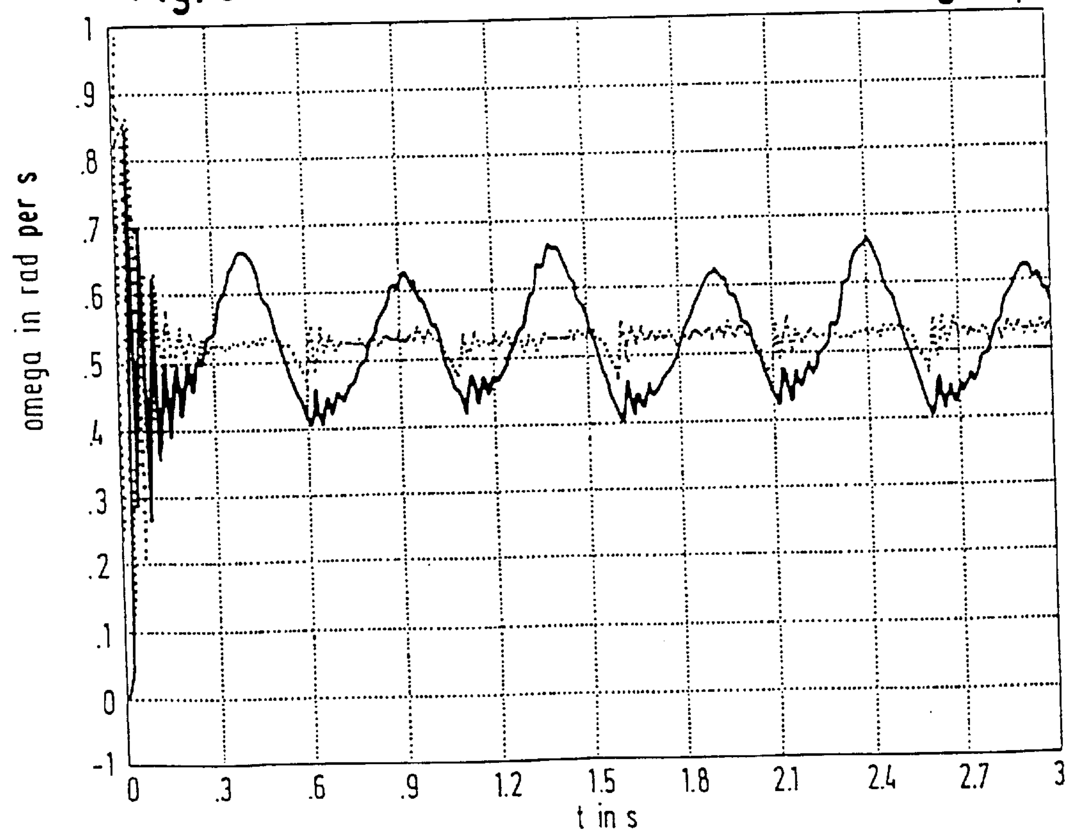

METHOD OF CORRECTION BETWEEN ELECTRICAL PHASE ANGLE AND MECHANICAL OUTPUT ANGLE OF STEPPER MOTOR

BACKGROUND OF THE INVENTION

For operating instruments with pointers, especially in vehicles, until now along with mechanical tachometers, bimetallic instruments and rotary coil instruments, rotary magnet quotient measuring mechanisms (DQMs) have predominantly been used. Recently, however, (two-phase) stepper motors are gaining more and more currency—especially in Europe. Such stepper motors are used both in the form of direct drives (NMB) and—preferably—in the form of gear motors (made by switec and VDO).

For direct drives, for reasons of torque and cost, only claw pole (tin-can) stepper motors have been used until now. At stepping angles of typically 7.5° to 15° for the requisite resolution of approximately 0.1°, these motors require triggering in the microstep mode. However, the standard types made in large-scale mass production exhibit a highly nonlinear relationship between the electrical phase angle and the mechanical output angle, so that the conventional sinusoidal triggering produces an entirely unacceptable jerky motion of the pointer. The reason for this is—among others—the mechanical resting moment of the motors.

Specially optimized types now exist that even with sinusoidal triggering have acceptable synchronous properties. However, these motors are more expensive to construct yet have poorer mechanical performance data than the corresponding standard types. Even then, their performance over the temperature and voltage range is not entirely satisfactory. Moreover, for the zero position or position control they require additional sensors, such as a Hall IC.

SUMMARY OF THE INVENTION

The method according to the invention for triggering a stepper motor having the characteristics of the body of the main claim has the advantage over the prior art that because of the correction of the trigger pulses, an especially simple encoder (digital angle encoder) from the "lowest-cost" price range can be used, and thus costs not much more than a zero sensors that detects the zero position of the stepper motor. Thus along with the zero position, the motion control of the stepper motor can be detected as well, and above all can also be used for correcting the microstep performance, and the resolution required is far below that needed in conventional control processes. As a result, it is possible to trigger the stepper motor successfully with a resolution of 0.1°, for instance, even though the angle encoder used cannot remeasure this high resolution.

By means of the provisions recited in the dependent claims, advantageous further features of and improvements to the method disclosed in the main claim are possible.

BRIEF DESCRIPTION OF THE DRAWINGS

An exemplary embodiment of the invention is shown in the drawing an described in further detail in the ensuing description.

FIG. 10 shows a fourth graph; and

FIG. 11 shows a fifth graph.

DESCRIPTION OF THE PREFERRED EMBODIMENTS

Figure 1:
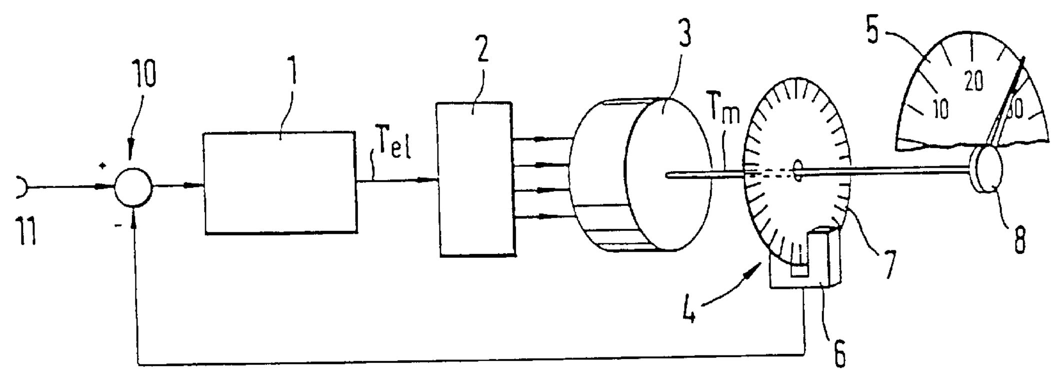
FIG. 1 shows a first block circuit diagram in accordance with the prior art.

The first block circuit diagram of FIG. 1 shows a known stepper motor 3, on whose shaft an encoder or angle encoder 4 is nondetachably disposed. The angle encoder 4 has a stationary photoelectric barrier 6, past which the marking of a code disk 7, which is nondetachably connected to the shaft of the armature of the stepped motor 3, passes. Also secured on the shaft by way of example is a pointer 8 for a gauge, with which a stationary scale disk 5 is associated. The gauge may be mounted in the instrument panel of a motor vehicle. The stepper motor 3 is supplied by an end stage 2 with current pulses that are generated by a preceding controller 1. The known controller, at a point 10, compares a command value 11 with the value measured by the angle encoder 4 and thus controls the current for the end stage 2 in open- or closed-loop fashion. This block circuit diagram applies to the known closed-loop control process for triggering a stepper motor in the microstep mode.

Figure 2:
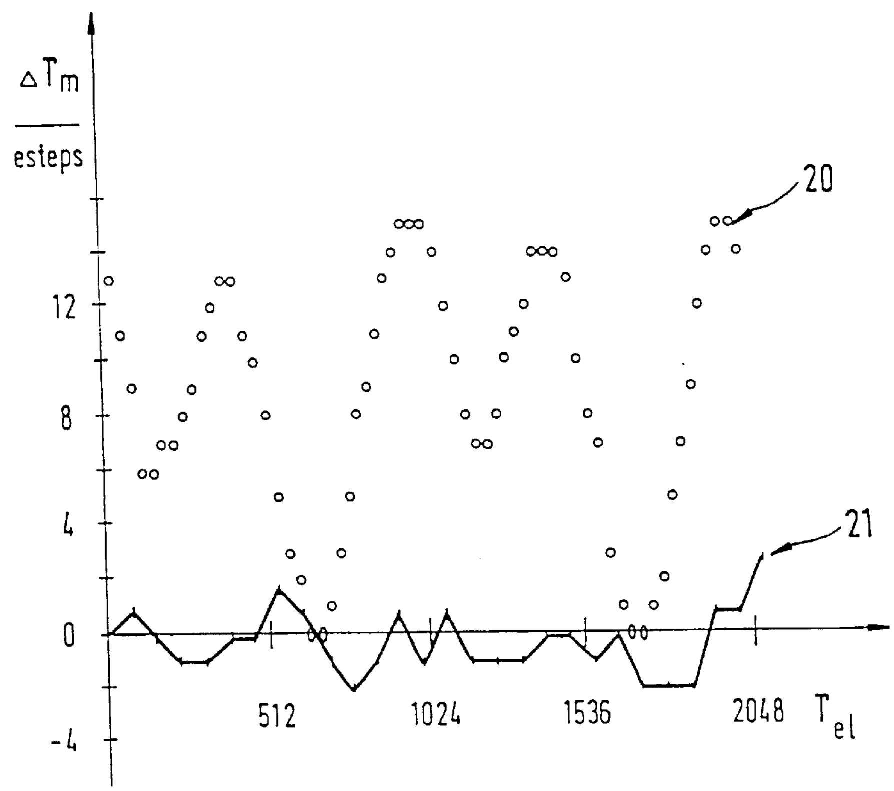
FIG. 2 shows a first graph.

FIG. 2 shows a first graph, in which the difference $\Delta\tau_m$ between the actual and the ideal mechanical angle $\tau$ is plotted, in the form of relative steps, over the electrical angle $\tau_{el}$. It can be seen from an uncorrected curve 20 that the difference of the various phase angles $\tau_{el}$ is relatively great. In the corrected curve 21, in which the correction was done by means of from 4 to 5 Fourier coefficients, only a very slight difference occurs.

Figure 3:
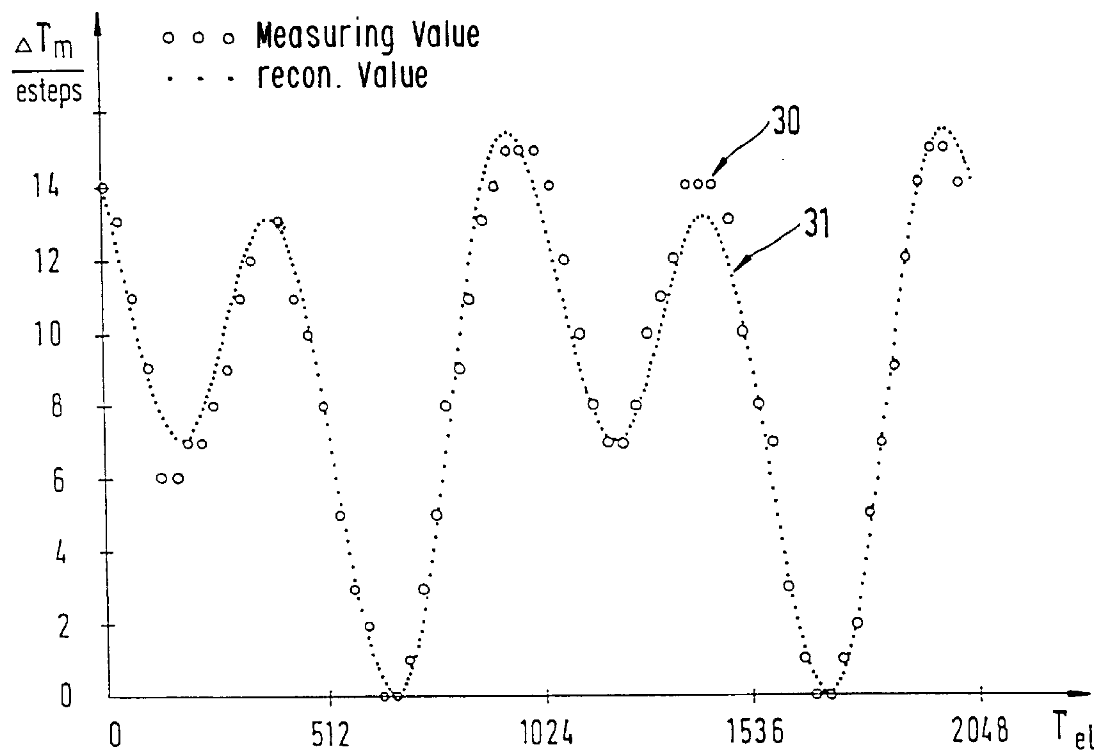
FIG. 3 shows a second graph.

FIG. 3 shows a second graph, in which a measured characteristic curve 30 for angle errors $\Delta\tau_m$ is compared with a reconstructed characteristic curve 31 that has been ascertained on the basis of the four Fourier coefficients $a_2$, $b_2$, $a_4$, $b_4$.

Figure 4:
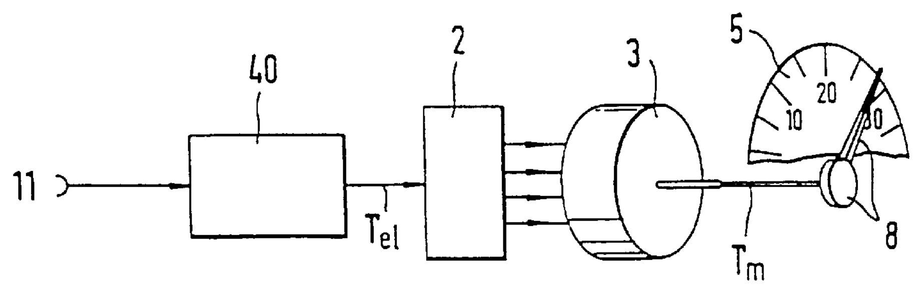
FIG. 4 shows a second block circuit diagram.

FIG. 4 shows a second block circuit diagram, as a first exemplary embodiment of the invention, for the stepper motor 3, in which the controller has a correction stage 40. In the correction stage 40, the Fourier coefficients ascertained are obtained by simplified Fourier synthesis, and their extraction will be explained later herein.

Figure 5:
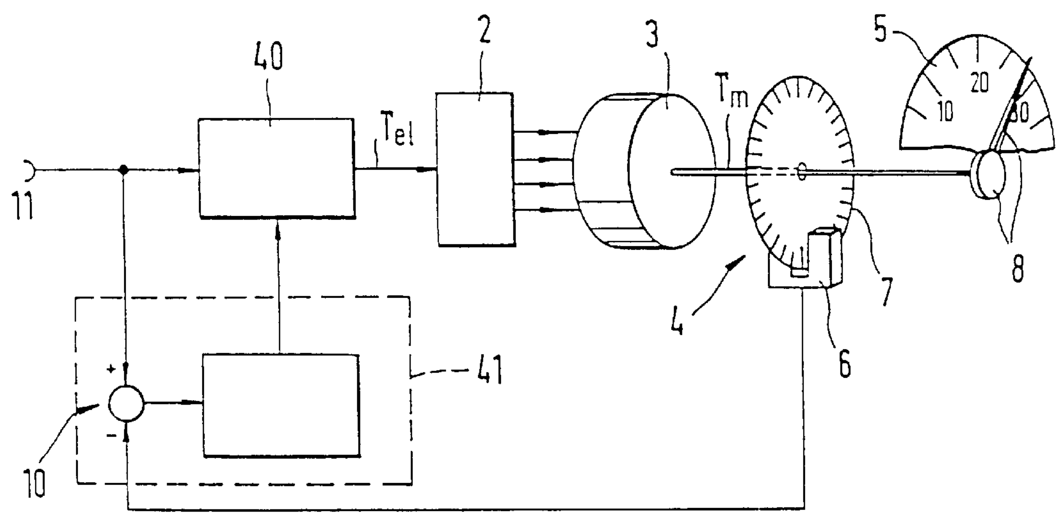
FIG. 5 shows a third block circuit diagram.

FIG. 5 shows a third block circuit diagram, in which the block circuit diagram of FIG. 4 has been supplemented with an adaptive coefficient adaptation 41. At the summation point 10, the signals of the angle encoder 4 are compared with command values 11. Depending on the result, current values are read out continuously from the coefficient memory and fed for correction purposes to the correction stage 40.

Figure 6A:
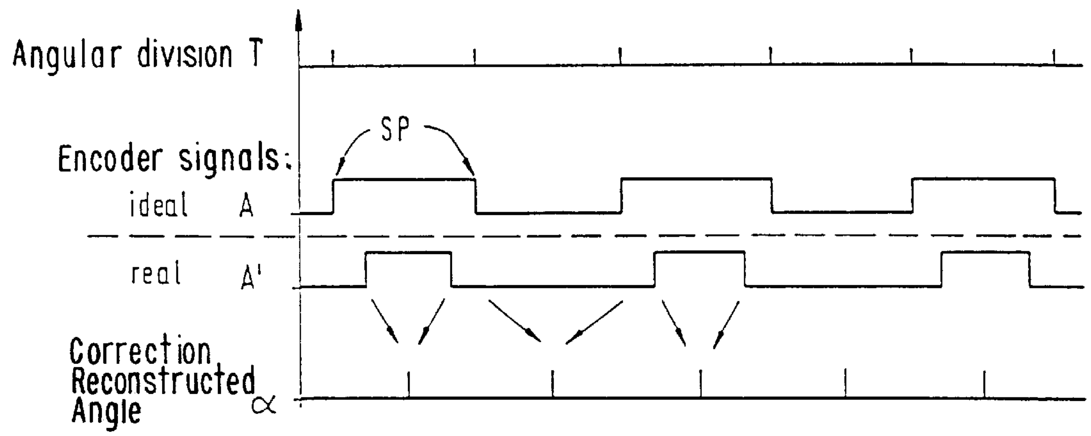
FIGS. 6*a* and *b* each show a second graph.

FIG. 6*a* shows a second diagram, in which the formation of correction values is shown. The top curve corresponds to the angular division on the code disk 7 of the angle encoder 4. The angle encoder 4 outputs ideal or real signals that correspond to the two curves shown below this. In the next curve, correction values are formed from the measured signals of the angle encoder 4; the correction values will be described in further detail later herein. By way of the real signals, they finally lead to correction values of the kind shown in the bottom curve.

The mode of operation of the correction method will be described below in detail.

The method of the invention is based on the assumption that a simple (possibly single-channel) encoder (digital angle encoder) entails not much more expense than a conventional zero sensor. However, it can be used not only for the zero position but also for motion control (self-diagnosis) and above all also for correction of the microstepping performance; the requisite resolution is far below that required in the conventional closed-loop control method (basic structure as in FIG. 1).

Because of the low angular resolution of "lowest cost" encoders, it is absolutely necessary in low-speed control events that the encoder pulses have a substantially excessively long period length, so that they can be used as angle signals for conventional closed-loop control. The following methods are conceivable to aid in this.

A. Increasing the resolution by analog evaluation of the encoder signals in accordance with the prior art, using high-grade glass scales. This requires analog/digital conversion of the signals and additionally requires either a relatively accurate encoder or complicated (digital) correction of the signals.

The encoder signal serves only to adaptively simulate parameters that affect the type of correction, and is therefore quite uncritical in terms of chronological and angular resolution. For such a method (in contrast to A and B), possibly an encoder with only a single channel might suffice. It must be considered a disadvantage, however, that faults of the controlled system can be compensated for only to the extent that they can be encompassed by the correction parameters. While this is relatively readily doable for the electromagnetically dictated nonlinearities mentioned at the outset imbalance-dictated angular deviations Nevertheless, it is not applicable to stochastic faults (for instance stick-slip method)

local faults ("hangups")

The present method corresponds to method C. Experience thus far with direct drives for stepper motors shows that periodic nonlinearities by far predominate over all other interfering factors, so that it is certainly possible to dispense with eliminating the other faults.

From an exemplary embodiment it is documented that the error of a single drive can be adequately accurately described with only four to five Fourier coefficients, so that only very little memory capacity (RAM) is needed for coefficients.

The present method corresponds to method C. Experience thus far with direct drives for stepper motors shows that periodic nonlinearities by far predominate over all other interfering factors, so that it is certainly possible to dispense with eliminating the other faults.

From an exemplary embodiment it is documented that the error of a single drive can be adequately accurately described with only four to five Fourier coefficients, so that only very little memory capacity (RAM) is needed for coefficients.

1. First, measurements of the actually occurring angular deviations in two-phase claw pole stepper motors are made, followed by Fourier analysis. The result found is that in these deviations, the fourth harmonic of the trigger frequency greatly predominates (referred to electrical cycles; that is, the fourth harmonic corresponds to the stepping frequency). These deviations correspond to the course of the resting moment. A further measurable deviation corresponds to the second harmonic cycle frequency (half the stepping frequency), presumably caused by absences of symmetry between the two magnetic circuits.

For correcting the thus-ascertained periodic deviations, only four Fourier coefficients ($a_2$, $b_2$, $a_4$, $b_4$) are accordingly required.

FIG. 3 by way of example shows a measured characteristic curve (angular error $\Delta\tau_m$ over absolute angle $\tau_{el}$) and the reconstructed characteristic curve based on the four Fourier coefficients ascertained.

2. Harmonic correction as conventional control

These coefficients can now be determined once and for all, for instance upon installation or monitoring of an electromechanical system, and programmed into the triggering (FIG. 4). The advantage of proceeding in this way is that the angle detection need not necessarily be built into every manufactured system but rather, which is economical, preferably only once in the test device. This is counteracted, however, by the disadvantage that drifting in the actual coefficients (temperature, supply voltage, aging) cannot be detected.

3. Harmonic correction as adaptive control

In the adaptive version, at least one simple encoder is required (FIG. 5) for each individual system. The system, with the appropriate software, is then in a position to adapt the coefficients itself, which in practice requires a maximum of one pointer revolution. All the instances of drift in the periodic faults are then detected continuously, and the correction coefficients are adapted accordingly; the result is an optimal correction over the service life. A certain self-diagnosis of the system is advantageously possible by evaluating the continuously detected deviations.

The encoder can at the same time be used to detect the zero point (for instance in combination with a stop).

4. Hysteresis correction

The stepper motor type described has a certain hysteresis on principle, typically of about 1°. This hysteresis can be taken into account in both correction principles; a possible overcompensation in the conventional control leads to extremely unsteady pointer travel. In adaptive control, the hysteresis can also be continuously remeasured and corrected accordingly.

In each case, it could be expedient for the real dependency of the hysteresis of the reversing angle—dictated by the magnetic hysteresis—to be simulated by means of a simple mathematical model.

5. Practical embodiment possibilities

The correction methods described have been programmed for a microcontroller and used in combination with pulse width modulation (PWM triggering) for triggering the stepper motor. For the conversion of the methods with the limited computation power of inexpensive processors, some software provisions are recommended:

mapping the deviations and correction coefficients to integer variables with a word width of 8 bits at maximum by means of suitable scaling calculating the angle functions via suitable tables calculating the Fourier coefficients and from them the correction values for one complete electrical cycle only at relatively large time or angle intervals (such as 100 μsec or 15°), and storage of the correction values in a table possibly, linear interpolation within certain angle ranges At high angular speeds, the adaptive component can be deactivated. On the one hand, this saves computation time, which becomes increasingly critical as the angular speed rises; on the other, the validity of the static correction characteristic curve is no longer adequately assured at high angular speeds.

At very high angular accelerations, the adaptive component should also be deactivated, because once again the validity of the characteristic curve is impaired.

Additional Considerations

In the simple encoders contemplated, there is fundamentally also the problem that their signals also involve systematic errors that moreover drift sharply with the temperature and on aging. To compensate for these errors, the following methods could be used:

A. Using the mean values of two adjacent switching points SP of a encoder channel A, instead of using the switching points themselves; in a simple way, this eliminates most of the (symmetrical!) instances of drift (FIG. 6A). This method could not be used in conventional closed-loop control, because the corrected measurement value (the mean value of one past measurement and one future measurement) can only be ascertained with a chronological offset. As an angular basis for the averaging, the electrical angle $\tau_{el}$ can for instance be used, whose resolution in the sense of the invention is substantially higher than that of the encoder. The application of this method is possible on the condition that the division of the encoder does correspond to the period of one deviation or a multiple thereof.

Figure 6B:
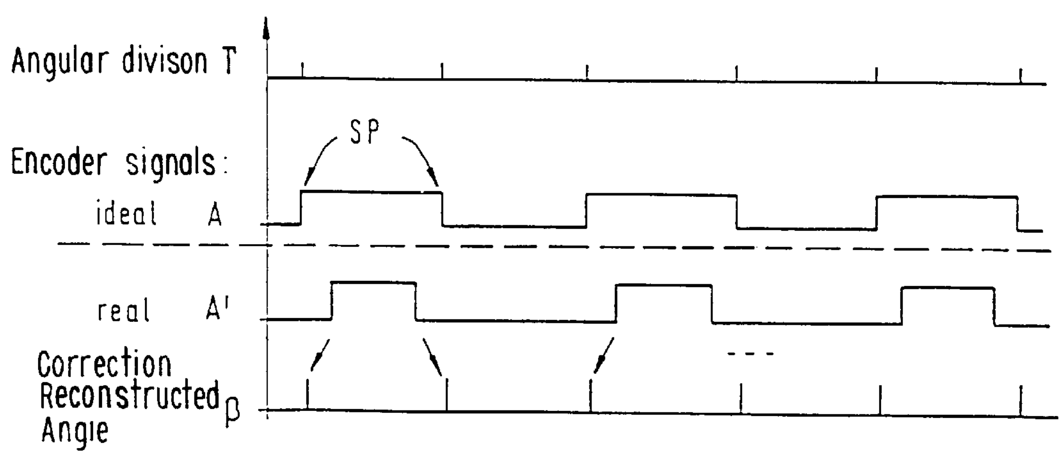
Figure 7:
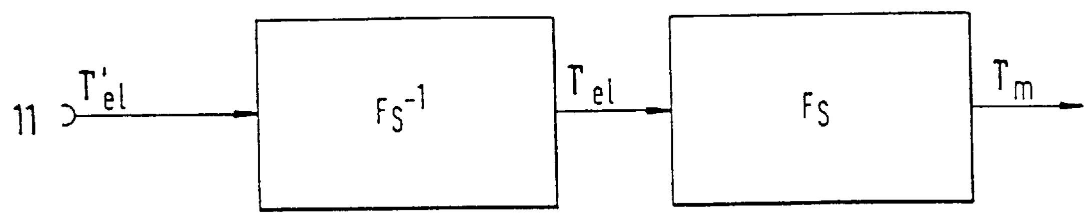
FIG. 7 shows a fourth block circuit diagram.

B. This method can be modified so that from the averaged length of the high or low periods of the encoder signal, a correction value for the signal edges is determined and taken into account in each evaluation (FIG. 6*b*).

C. As a generalization of these two simple methods, a correction method could be used, given suitable tuning of the encoder division to the stepping angles of the motor, which from an angular range that has been swept over calculates both the errors of the stepper motor and the errors of the encoder.

Theoretical observations on the exemplary embodiment

The theoretical foundations for compensating for periodic deviations in controlled systems will be explained in general below.

The controlled system with the transfer function $F_s$ is composed here of the stepped motor 3 with the triggering means 2 and the mechanical system comprising the shaft, pointer 8 and code disk 6 (see FIG. 1). The nonlinearities to be compensated for result practically solely from the transfer function of the motor 3.

If the system transfer $F_s$ is known sufficiently accurately, then theoretically the total transfer $\tau_m/\tau'_{el} \geqq 1$ can be generated by preceding it with the inverse system transfer $F_s^{-1}$.

(Unless otherwise indicated, the angles $\tau_{el}$, $\tau'_{el}$ are expressed in the units (esteps) of the mechanical angle $\tau_m$.)

Under the preconditions stated above, closed-loop control is accordingly unnecessary in the limit case.

However, since the system transfer cannot be ascertained arbitrarily accurately regardless of this, the inverse system transfer $F_s^{-1}$ cannot be determined analytically, or while it can be determined cannot be realized exactly, the properties of $F_s$ and thus of $F_s^{-1}$ can vary over time (from temperature factors and aging, for instance), in the practical application feedback is necessary, which in the broadest sense can be called closed-loop control (FIG. 8):

From this, the following schematic procedure can be derived:

1) pickup of the system properties 2) (approximate) calculation of the inverse system transfer $F_s^{-1}$ 3) followup of the parameters of $F_s^{-1}$ from the control deviation $\tau'_{el}-\tau_m$ in operation by means of a suitable algorithm.

For the dynamic range in question, a sufficiently accurate detection of the static angular deviation suffices. This characteristic curve must accordingly be detected and a modified triggering calculated from i, and an algorithm for varying this modification must be provided from the operating behavior.

Figure 8:
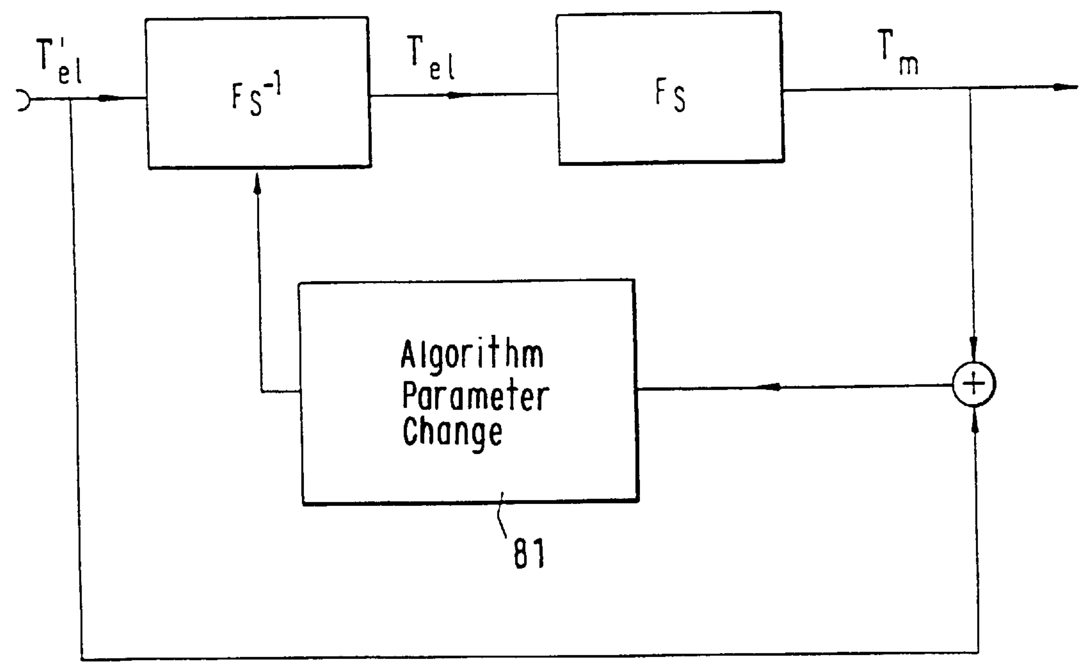
FIG. 8 shows a fifth block circuit diagram.

An important peripheral condition here is that the modified triggering $F_s^{-1}$ is a sufficiently smoothed function, or in other words that random errors have been averaged out since the pointer travel would otherwise be unnecessarily rough (FIG. 8).

To meet these conditions, the Fourier transform of the angular deviation is calculated in accordance with FIG. 12. Since the period length of the fundamental oscillation and the harmonics is known, it suffices to develop the deviation $\Delta\tau_m$ in a Fourier series. For a development up to the Kth harmonic (2K+1) sampling values are required. In a computation program, N=64 sampling values per electrical period are picked up, although the Fourier series is developed only up to the fifth harmonic. As a result, an approximation of the curve in the sense of the method of least squares (averaging) is attained. A further reason to use N=64 is that this reduces the required multiplications/divisions during the running of the program. The error is indicated in the "esteps" unit. From the sampling of an electrical period the following sampling set, for example, was ascertained:

| n | 0 | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|---|
| $\Delta T_m$ | 13 | 12 | 10 | 8 | 6 | 6 | 7 | 7 | 8 | 9 | 11 | 12 | 13 | 13 | 11 | 10 |
| n | 16 | 17 | 18 | 19 | 20 | 21 | 22 | 23 | 24 | 25 | 26 | 27 | 28 | 29 | 30 | 31 |
| $\Delta T_m$ | 8 | 5 | 3 | 2 | 0 | 0 | 1 | 3 | 5 | 8 | 9 | 11 | 13 | 14 | 15 | 15 |
| n | 32 | 33 | 34 | 35 | 36 | 37 | 38 | 39 | 40 | 41 | 42 | 43 | 44 | 45 | 46 | 47 |
| $\Delta T_m$ | 15 | 14 | 12 | 10 | 8 | 7 | 7 | 8 | 10 | 11 | 12 | 14 | 14 | 14 | 13 | 10 |
| n | 48 | 49 | 50 | 51 | 52 | 53 | 54 | 55 | 56 | 57 | 58 | 59 | 60 | 61 | 62 | 63 |
| $\Delta T_m$ | 8 | 7 | 3 | 1 | 0 | 0 | 1 | 2 | 5 | 7 | 9 | 12 | 14 | 15 | 15 | 14 |

(One sampling set should be ascertained for each of the two directions of rotation of the motor.)

Calculation of the Fourier coefficients $a_k$, $b_k$ (=Fourier analysis):

$\tau_{el}$ (n)=n*32 ($\tau_{el}$ in s steps, sin resolution: 2048 s steps)

$$a_k = 2/N * \sum_{u=0}^{N-\lambda} \Delta\tau_m(n) * \cos(k * \tau_{el}(n)) \text{für } k = 0, 1 \ldots K$$

$$b_k = 2/N * \sum_{u=0}^{N-\lambda} \Delta\tau_m(n) * \sin(k * \tau_{el}(n)) \text{für } k = 1 \ldots K$$

N: number of sampled values

K: maximum harmonic index.

From the exemplary sampling set it thus follows that:

| k | 0 | 1 | 2 | 3 | 4 |
|---|---|---|---|---|---|
| $a_k$ | 17,63 | −0,3880 | 2,871 | 0,2139 | 2,250 |
| $b_k$ | 0,0 | −0,3914 | 2,337 | −0,1496 | −4,675 |
| **k** | **5** | **6** | **7** | **8** | **9** |
| $a_k$ | −0,1199 | 0,2904 | −0,1558 | 0,2225 | −0,07786 |
| $b_k$ | −0.1392 | 0,4147 | −0,1018 | 0,1547 | −0,03751 |

Figure 9:
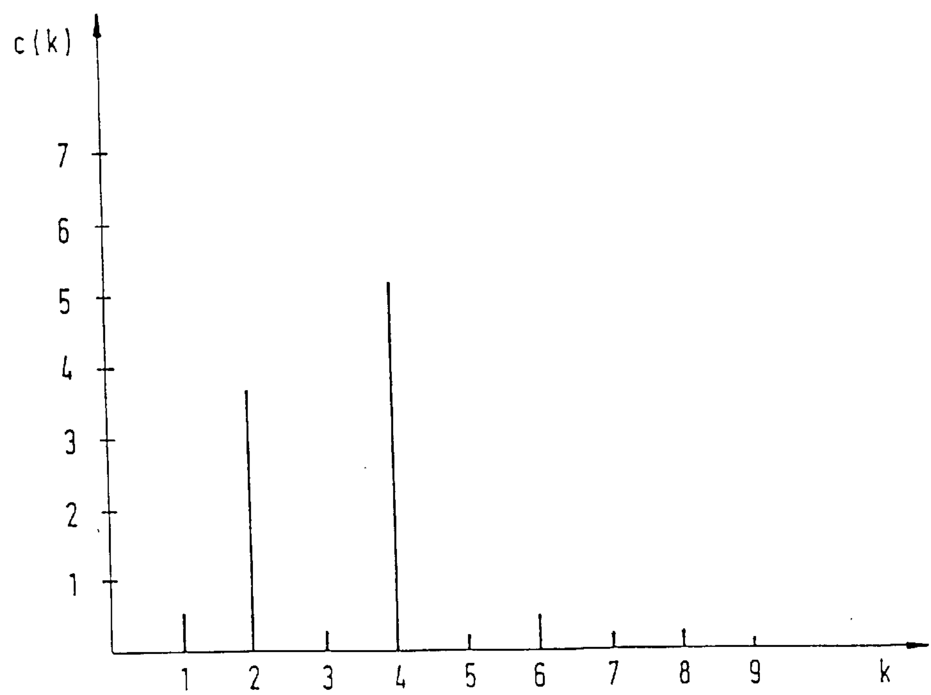
FIG. 9 shows a third graph.

For illustration purposes, the amplitude $c_k=\sqrt{(a_k{}^2+b_k{}^2)}$ is shown in FIG. 9. The reconstruction of the periodic function $\Delta\tau_m$ ($\tau_{el}$) can be done by equation (4.2.1) (=Fourier synthesis):

$$\Delta\tau_m(\tau_{el}) = \alpha_o/2 + \sum_{k=\lambda}^{K} a_u * \cos(k * \tau_{el}) + \sum_{u=\lambda}^{K} b_u * \sin(u * \tau_{el}) \tag{4.2.1}$$

For an accurate reconstruction, the coefficients for the k values 0, 2, 4 suffice, as a comparison of the original deviation with the thus-reconstructed deviation (FIG. 3) shows: All the deviation information is thus contained in the five coefficients, which in an embodiment in the form of a program requires correspondingly little RAM space (5 bytes if they are stored in memory as signed char).

Based on the deviation, a modified triggering ($F_s^{-1}$) can now be indicated:

If as a precondition the electrical angle is expressed in esteps, equation (4.2.2) results:

$$\tau_m=\tau_{el}+\Delta\tau_m(\tau_{el}) \tag{4.2.2}$$

The goal is an overall behavior of the motor, which can be described by the equation $$\tau_m=\tau'_{el} \tag{4.2.3}$$

or in other words a proportional relationship between the angle $\tau'_{el}$ (to be specified) and the resultant angle $\tau_m$.

$$\tau'_{el}=\tau_{el}+\Delta\tau_m(\tau_{el}) \tag{4.2.4}$$

From an angle $\tau'_{el}$ to be specified, the actual triggering would have to be ascertained from (4.2.4), and then equation (4.2.3) would be satisfied. This requires calculating the inverse function of (4.2.4).

$$\tau'_{el}=f(\tau_{el})\rightarrow\tau_{el}=f^{-1}(\tau'_{el})$$

The transfer function does exist (unambiguousness), but cannot be determined analytically.

An approximation solution could be calculated, for instance, by iterative methods.

With a view to realization, this method, which requires much computation and hence time, is not very suitable. An approximation solution therefore appears more favorable, in which the following is set:

$$\Delta\tau_m(\tau_{el})\approx\Delta\tau_m(\tau'_{el}) \tag{4.2.5}$$

and hence it follows from equation (4.2.4) that $$\tau'_{el}=\tau_{el}+\Delta\tau_m(\tau'_{el}) \tag{4.2.6}$$

At a given $\tau'_{el}$, the trigger value $\tau_{el}$ can thus be calculated in a simply way. However, since the transfer function is not calculated for this triggering, this method generates a basic residual error:

Equation (4.2.2):

$$\tau_m=\tau_{el}+\Delta\tau_m(\tau_{el})$$

Insertion of the equation (4.2.6):

$$\tau_m=\tau'_{el}-\Delta\tau_m(\tau'_{el})+\Delta\tau_m(\tau'_{el}-\Delta\tau_m(\tau'_{el})) \tag{4.2.7a}$$

and therefore $$\tau_m=\tau'_{el}+rf(\tau'_{el}) \tag{4.2.7b}$$

so that along with the desired proportional term $\tau'_{el}$, the residual error rf($\tau'_{el}$) also appears on the right-hand side of equation (4.2.7):

$$rf(\tau'_{el})=-\Delta\tau_m(\tau'_{el})+\Delta\tau_m(\tau'_{el}-\Delta\tau_m(\tau'_{el}))$$

Thus rf($\tau'_{el}$) comes about by the fact that the error function $\Delta\tau_m$ ($\tau_{el}$) is evaluated on the one hand at the point $\tau'_{el}$, and at the other on the modified point $\tau'_{el}-\Delta\tau_m$ ($\tau'_{el}$), and the difference between the two function values is formed.

$$\rightarrow rf(\tau'_{el})<<\Delta\tau_m(\Delta\tau'_{el}),$$

which demonstrates the basic capability of the method. Conclusions about the quality of the method can be drawn with the aid of a simulation. In FIGS. 10 and 11, the matrix simulation outcomes for the angle error and for the angular speed ($W_{soll}$=0.5 rad/s) are plotted for corrected and non-corrected triggering.

Adaptive Component

This last-discussed method is based on the assumption that the angle error characteristic curve remains constant—even over relatively long periods of time. In an actual motor, however, the possibility exists that the curve may vary in response to various factors (such as temperature and aging). To keep the triggering optimal at all times, this variation must be taken into account. In principle, two possibilities present themselves.

1) controlled followup of the coefficients $a_k$, $b_k$

If all the relevant factors and the dependency of the error curve on these factors are known, then a controlled followup of the coefficients $a_k$, $b_k$ can be done by means of sensor data (for instance, temperature sensors), which are possibly available anyway.

2) real-time detection and real-time processing of the remaining error curve that results upon triggering with the corrected values, as a result of which a constant modification of the coefficients $a_k$, $b_k$ is done.

Suggestion 2 corresponds to the present invention in accordance with FIG. 5, which shows the structure from the standpoint of closed-loop control (FIG. 8). In the realization, various aspects must be taken into account:

1) In operation, it is not possible to periodically carry out a new pickup of the error characteristic curve, because that would mean triggering with uncorrected values.

2) In operation, a reversal of the direction of rotation is always possible; that is, even with corrected triggering, it cannot be assumed that an electrical period will be traversed entirely and that from it a total correction can be calculated. Instead, individual isolated measured values of the "control deviation" must be processed in such a way that a followup of the triggering correction results.

To do so, the following method is proposed:

If in operation an electrical angle is triggered at which a sampled value was formed in the original pickup of the error curve, then first the control deviation diff=[paste in . . . ] (in esteps). Let n be the coefficient of the sampled value, and let l be the travel variable for the status after the lth variation; it is then true that:

$$\Delta\tau_m(n)^{1+l} \approx \Delta\tau_m(n)^1 + \mathrm{diff}(n)$$

in accordance with the above considerations.

From this, the modification of the kth coefficient by the nth sampled value follows:

$$a_k^{i+l} = a_k^{\,i} + 2/N^* (-\Delta\tau m(n)^{i*}\cos(k^*\tau_{el}(n)) + \Delta\tau_m(n)^{1+i*}\cos(k^*\tau_{el}(n)) = a_k^{\,i} + 2/N^* diff(n)^*\cos(k^*\tau_{el}(n)) \quad (4.2.8a)$$

$$b_k^{l+l} = b_k^{\,l} + 1/N diff(n)^*\sin(k^*\tau_{el}(n)) \quad (4.2.8b)$$

It is accordingly not necessary to know the last error value $\Delta\tau_m(n)^1$.

Thus simple methods for modifying the coefficients $a_k$, $b_k$ have been found.

By a suitable choice of parameters and scaling factors, two of the three multiplications involved in equation (4.2.8a, b) and the division can be omitted in the ADAP program. As demonstration of the capability of the method, all the coefficients $a_k$, $b_k$ and all the sampled values can be occupied beforehand by zero in the program, with the result that initially, triggering with a noncorrected curve takes place. In the course of the performance of some electrical periods, the coefficients $a_k$, $b_k$ and thus the modified triggering $F_s^{-1}$ are ascertained automatically by the program; the pointer travel is then identical to that when the original method is performed, in which first the error curve was sampled overall and Fourier-transformed, so that the adaptation method could not become effective until triggering with already-corrected values.

In conclusion, it should be pointed out once again that fundamentally, the adaptation method in question can be used for a relatively low dynamic range. If the motor is operated in a higher dynamic range, the dynamic moments gain increasing influence on the motor performance and therefore no longer be ignored. For that range, the adaptive portion of the method should therefore be omitted.

We claim:

1. A method for microstep triggering of a stepper motor, preferably a claw pole stepper motor, having a controller that outputs current or voltage pulses as a pulse train of a sinusoidal-like course to the stepper motor, as a result of which the rotor of the stepper motor rotates onward in microsteps, characterized in that the mechanical annular rotation ($\tau_m$) of the stepper motor is detected by means of an angle encoder (encoder); that the controller forms the difference ($\Delta\tau_m$) between the electrical phase angle ($\tau_{el}$) and the mechanical angle of rotation ($\tau_m$) of the stepper motor; that from the difference ($\Delta\tau_m$) in accordance with a specified algorithm, the controller forms a corrected signal for the stepper motor, so that the controller first forms correction coefficients, at least one periodicity of the difference ($\Delta\tau_m$) is mapped on the correction coefficients, and the controller then with consideration of these correction coefficients forms the corrected signal for the stepper motor, which is used for further operation of the stepper motor; the controller includes correction coefficients for compensating for the hysteresis of the stepper motor; and the correction coefficients for the compensating of the hysteresis are varied in operation, using the measurement data of the angle encoder.

2. The method of claim 1, characterized in that the correction coefficients include Fourier coefficients of the angle difference $\Delta\tau$.

3. The method of claim 2, characterized in that the Fourier coefficients are formed for second and fourth harmonics of the difference ($\Delta\tau_m$).

4. The method of claim 1, characterized in that the controller writes the correction coefficients in a memory.

5. The method of claim 2, characterized in that the coefficients are determined once and for all and are stored in the memory of the controller (1).

6. The method of claim 1, characterized in that the method the stepper motor is used preferably for a gauge in a motor vehicle.

7. The method of claim 1, characterized in that the differences ($\Delta\tau_m$) of several electrical cycles of the stepper motor are used for determination of the correction coefficients for an electrical cycle of the stepper motor.

* * * * *